United States Patent
Han

(10) Patent No.: US 11,382,207 B2
(45) Date of Patent: Jul. 5, 2022

(54) ELECTRONIC DEVICE MODULE AND METHOD OF MANUFACTURING ELECTRONIC DEVICE MODULE

(71) Applicant: Samsung Electro-Mechanics Co., Ltd., Suwon-si (KR)

(72) Inventor: Kyung Ho Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/022,530

(22) Filed: Sep. 16, 2020

(65) Prior Publication Data

US 2021/0007214 A1 Jan. 7, 2021

Related U.S. Application Data

(63) Continuation of application No. 16/737,154, filed on Jan. 8, 2020, now Pat. No. 11,071,196.

(30) Foreign Application Priority Data

Apr. 5, 2019 (KR) .................. 10-2019-0040073
Jul. 19, 2019 (KR) .................. 10-2019-0087794

(51) Int. Cl.
*H05K 1/02* (2006.01)
*H05K 1/18* (2006.01)
(Continued)

(52) U.S. Cl.
CPC .......... *H05K 1/0216* (2013.01); *H05K 1/181* (2013.01); *H05K 3/0011* (2013.01); *H05K 3/284* (2013.01);
(Continued)

(58) Field of Classification Search
CPC ...... H05K 1/0216; H05K 1/181; H05K 3/284; H05K 2201/10371; H05K 1/0218; H05K 9/0009
(Continued)

(56) References Cited

U.S. PATENT DOCUMENTS 10,163,810 B2  12/2018  Li et al.
2004/0232452 A1  11/2004  Tsuneoka et al.
(Continued)

FOREIGN PATENT DOCUMENTS

JP    2016-072411 A    5/2016
KR   10-2015-0009728 A    1/2015
(Continued)

OTHER PUBLICATIONS

Korean Office Action dated Jul. 31, 2020 issued in the corresponding Korean Patent Application No. 10-2019-0087794 (6 pages in English, 5 pages in Korean).
(Continued)

*Primary Examiner* — Sherman Ng
(74) *Attorney, Agent, or Firm* — NSIP Law

(57) ABSTRACT

An electronic device module may include: a board; a ground electrode disposed on a first surface of the board; a sealing portion disposed on the first surface of the board; electronic devices mounted on the first surface of the board such that at least one of the electronic devices is embedded in the sealing portion; a first shielding wall connected to the ground electrode and disposed along a side surface of the sealing portion; and a shielding layer formed of a conductive material and disposed along a surface formed by the sealing portion and the first shielding wall.

26 Claims, 12 Drawing Sheets

(51) Int. Cl.
*H05K 3/40* (2006.01)
*H05K 3/00* (2006.01)
*H05K 3/28* (2006.01)
*H05K 3/30* (2006.01)

(52) U.S. Cl.
CPC ........... *H05K 3/303* (2013.01); *H05K 3/4007* (2013.01); *H01L 2924/181* (2013.01); *H05K 2201/0715* (2013.01)

(58) Field of Classification Search
USPC ......................................................... 361/760
See application file for complete search history.

(56) References Cited

U.S. PATENT DOCUMENTS

| | | | |
|---|---|---|---|
| 2007/0246825 A1* | 10/2007 | Oh | H01L 23/552 257/728 |
| 2008/0210462 A1 | 9/2008 | Kawagishi et al. | |
| 2012/0008288 A1* | 1/2012 | Tsukamoto | H01L 24/97 361/736 |
| 2012/0025356 A1* | 2/2012 | Liao | H01L 23/3121 257/659 |
| 2014/0085857 A1* | 3/2014 | Chen | H01L 23/3121 361/818 |
| 2015/0043189 A1 | 2/2015 | Kitazaki et al. | |
| 2016/0095267 A1 | 3/2016 | Kitazaki et al. | |
| 2016/0149300 A1* | 5/2016 | Ito | H01Q 23/00 343/841 |
| 2017/0243832 A1* | 8/2017 | Hong | H01L 21/32051 |
| 2017/0263569 A1 | 9/2017 | Sommer et al. | |
| 2017/0345793 A1 | 11/2017 | Miyairi | |
| 2018/0077829 A1* | 3/2018 | Yamamoto | B32B 15/08 |
| 2018/0092201 A1 | 3/2018 | Otsubo et al. | |
| 2018/0092257 A1 | 3/2018 | Otsubo et al. | |
| 2018/0277490 A1 | 9/2018 | Yoon et al. | |
| 2018/0286816 A1 | 10/2018 | Kitazaki et al. | |
| 2019/0274237 A1* | 9/2019 | Otsubo | H01L 24/97 |
| 2019/0310687 A1* | 10/2019 | Hong | G06F 1/1656 |

FOREIGN PATENT DOCUMENTS

| | | |
|---|---|---|
| KR | 10-2018-0021336 A | 3/2018 |
| KR | 10-2018-0101832 A | 9/2018 |
| KR | 10-2018-0107877 A | 10/2018 |
| WO | WO-2018101381 A1 * | 6/2018 ............. H01L 24/32 |

OTHER PUBLICATIONS

United States Notice of Allowance dated May 26, 2021, in related U.S. Appl. No. 16/737,154 (15 pages in English).

United States Office Action dated Nov. 12, 2020 in related U.S. Appl. No. 16/737,154 (19 pages in English).

* cited by examiner

ELECTRONIC DEVICE MODULE AND METHOD OF MANUFACTURING ELECTRONIC DEVICE MODULE

CROSS-REFERENCE TO RELATED APPLICATIONS

This application is a continuation of U.S. patent application Ser. No. 16/737,154 filed on Jan. 8, 2020, which claims the benefit under 35 U.S.C. § 119(a) of Korean Patent Application Nos. 10-2019-0040073 and 10-2019-0087794 filed on Apr. 5, 2019 and Jul. 19, 2019, respectively, in the Korean Intellectual Property Office, the entire disclosures of which are incorporated herein by reference for all purposes.

BACKGROUND

1. Field

The following description relates to an electronic device module and a method of manufacturing an electronic device module. More specifically, the following description relates to an electronic device module capable of protecting an electronic component, or the like, included in the electronic device module, from an external environment and shielding electromagnetic waves.

2. Description of Related Art

Recently, there has been rapidly increasing demand for portable devices in the electronic products market, and miniaturization and weight reduction of electronic devices mounted on such portable devices are desired.

In order to manufacture miniaturized and lightweight electronic devices, there has been demand not only for technology for reducing sizes of individual components mounted thereon, but also for System-on-Chip (SoC) technology for providing a plurality of individual devices in one chip or System-in-Package (SiP) technology for providing numerous individual devices in a single package.

In particular, there has been demand for high-frequency electronic device modules, such as communication modules or network modules configured to handle high-frequency signals, to be miniaturized and provided with a structure shielding against various types of electromagnetic interference (EMI) in order to implement outstanding shielding characteristics against EMI.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes: a board; a ground electrode disposed on a first surface of the board; a sealing portion disposed on the first surface of the board; electronic devices mounted on the first surface of the board such that at least one of the electronic devices is embedded in the sealing portion; a first shielding wall connected to the ground electrode and disposed along a side surface of the sealing portion; and a shielding layer formed of a conductive material and disposed along a surface formed by the sealing portion and the first shielding wall.

A thickness of a portion of the shielding layer disposed on a side surface of the first shielding wall may be less than a thickness of a portion of the shielding layer disposed on an upper surface of the sealing portion.

The first shielding wall and the shielding layer may be formed of different materials.

The shielding may be spaced apart from the ground electrode.

The shielding layer may be spaced apart from the board.

The electronic device module may further include an external sealing portion disposed between the board and a bottom of the shielding layer.

At least a portion of the shielding layer may be disposed on the board.

A groove may be formed along an edge of the first surface of the board, and the shielding layer may be disposed in the groove.

The electronic device module may further include a second shielding wall formed of a conductive material. The second shielding wall may be connected to the ground electrode and may divide the sealing portion.

At least one of the electronic devices may be disposed outside of the sealing portion.

A width of the shielding wall may decrease in a direction from an end of the shielding wall spaced from the board toward the board.

The shielding wall may include an extension portion disposed at a top portion of the shielding wall and having a width that is greater than a width of a remainder of the shielding wall.

A top surface of the first shielding wall may be larger than a bottom surface of the first shielding wall.

The electronic device module may further include an antenna disposed on a second surface of the board opposite to the first surface of the board, or disposed inside the board and adjacent to the second surface of the board.

In another general aspect, a method of manufacturing an electronic device module includes: forming a ground electrode on a first surface of a board; mounting electronic devices on the first surface of the board; forming a sealing portion embedding at least one of the electronic devices on the first surface of the board; forming a trench by partially removing the sealing portion such that the ground electrode is exposed; forming a shielding wall by filling the trench with a conductive material; removing an external sealing portion of the sealing portion disposed on an external side of the trench; and forming a shielding layer along a surface formed by the sealing portion and the shielding wall.

The removing of the external sealing portion may include removing the external sealing portion using a blade while preventing the blade from contacting the board.

The method may further include removing a part of the board disposed on a lower part of the external sealing portion.

In another general aspect, an electronic device module includes: a board; a ground electrode disposed on a surface of the board; an electronic device mounted on the surface of the board; a sealing portion disposed on the surface of the board and surrounding the electronic device; an external sealing portion disposed on the surface of the board such that the external sealing portion is spaced apart from the sealing portion; a shielding wall disposed along a side surface of the sealing portion, between the sealing portion and the external sealing portion, and having a lower surface disposed on the ground electrode; and a conductive shielding layer disposed along a side surface of the shielding wall, and along upper surfaces of the sealing portion and the shielding wall, and having an end disposed on the external sealing portion.

The conductive shielding layer may be entirely spaced apart from the board.

The conductive shielding layer may be entirely spaced apart from the ground electrode.

The sealing portion may include a resin material.

In another general aspect, an electronic device module includes: a board; a ground electrode disposed on a surface of the board; an electronic device mounted on the surface of the board; a sealing portion disposed on the surface of the board and encasing the electronic device; an external sealing portion disposed on the surface of the board such that the external sealing portion is spaced apart from the sealing portion; a shielding wall disposed on the board, between the sealing portion and the external sealing portion, and in contact with the ground electrode; and a conductive shielding layer including a top wall disposed on the shielding wall and the sealing portion, and a side wall disposed on the shielding wall and the external shielding portion.

The side wall may be spaced apart from the board by the external shielding portion.

The side wall may be spaced apart from the ground electrode.

The external sealing portion may be disposed on an outer side surface of the shielding wall.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
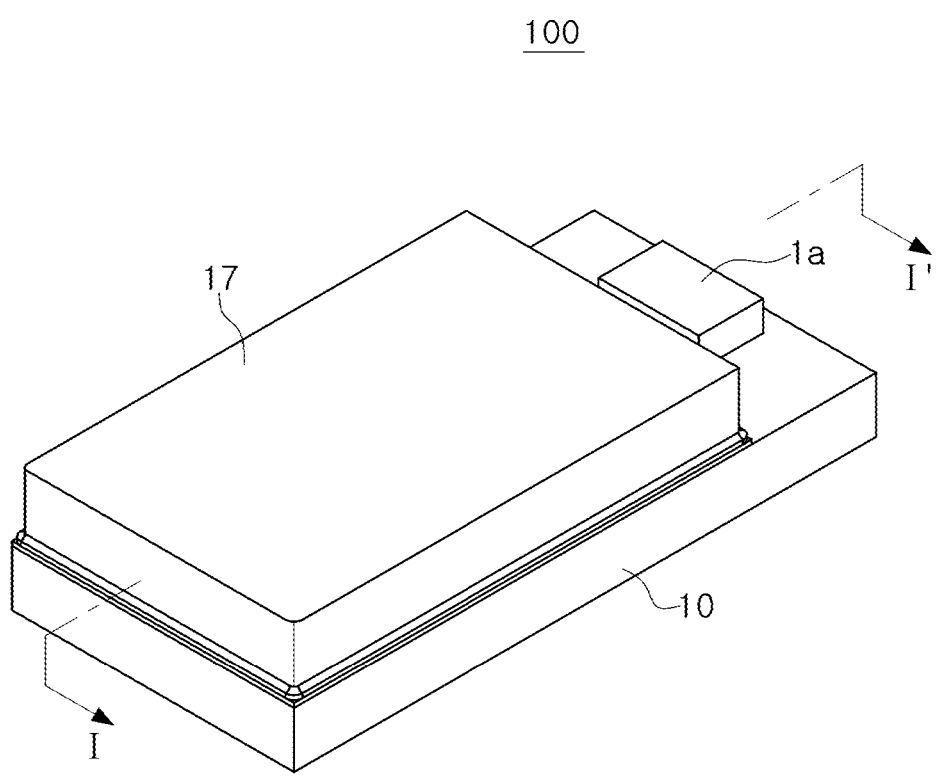
FIG. 1 is a perspective view of an electronic device module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

According to an aspect of the disclosure, an electronic device module includes an EMI-shielding structure having excellent EMI or electromagnetic wave resistance. According to another aspect of the disclosure, a method for manufacturing an electronic device module including an EMI-shielding structure is provided.

Figure 2:
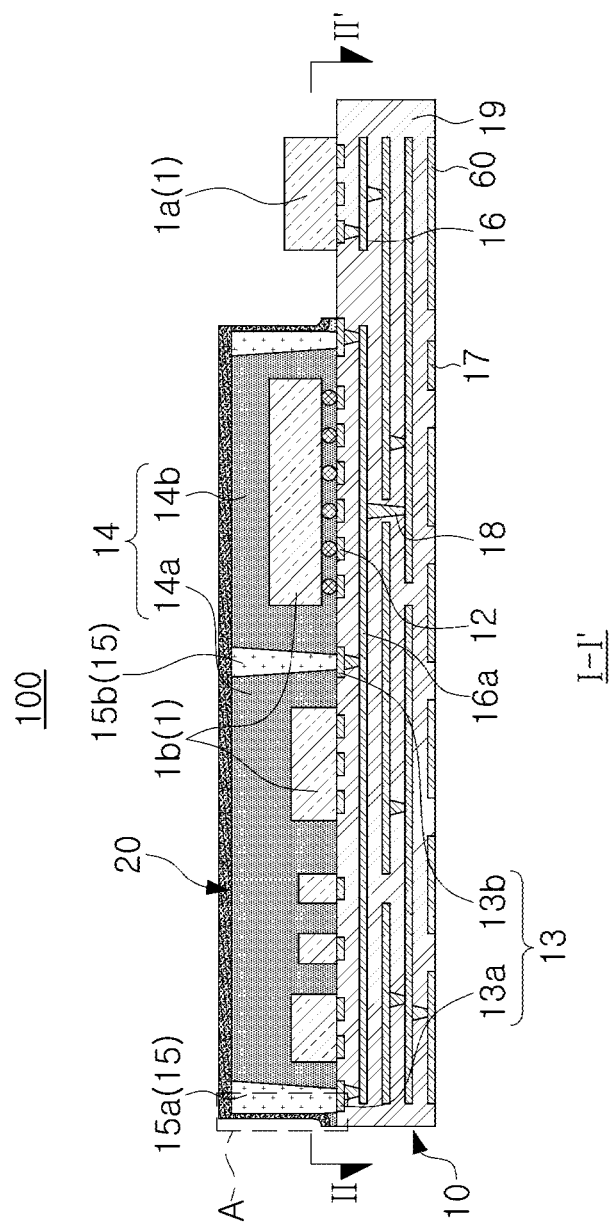
FIG. 2 is a cross-sectional view taken along line I-I' of FIG. 1.
Figure 3:
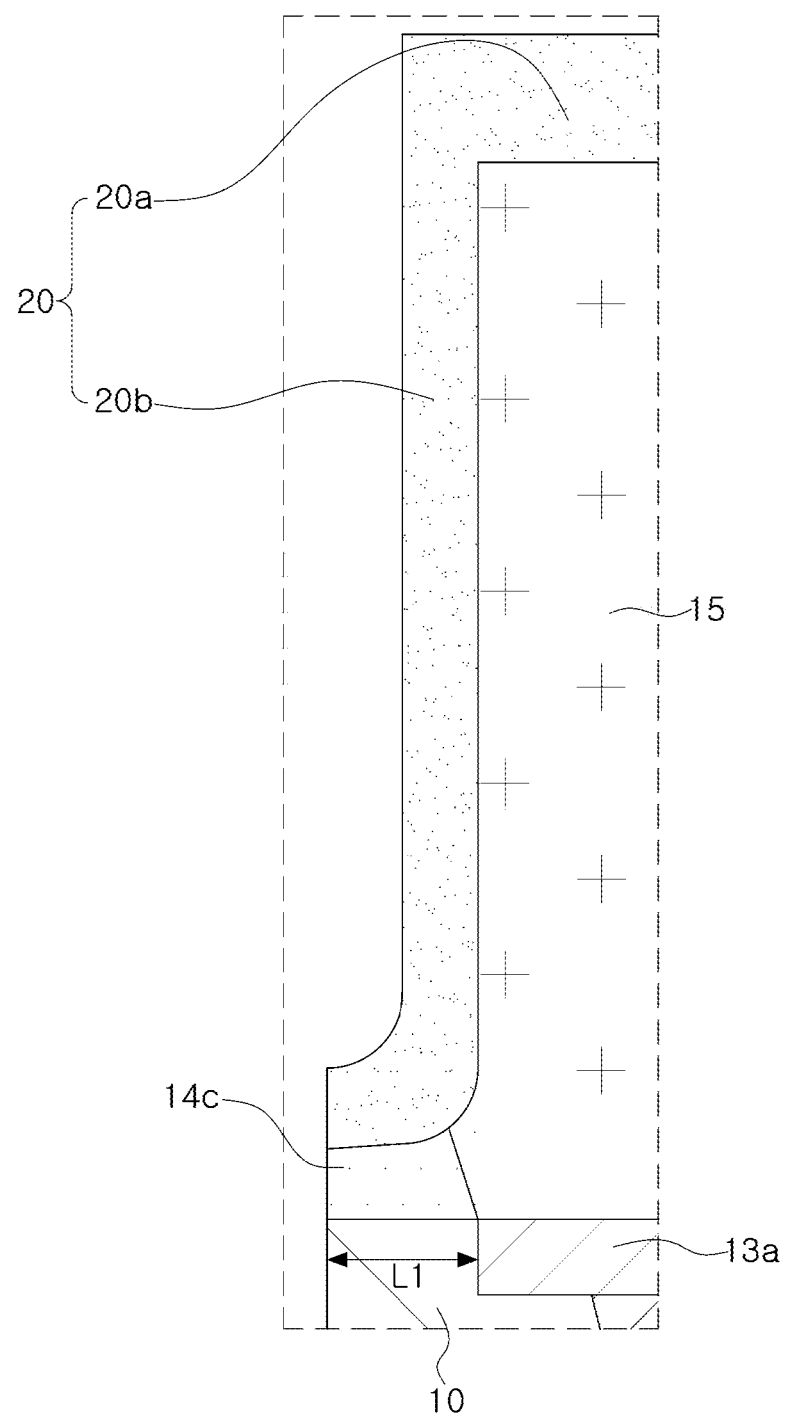
FIG. 3 is an enlarged view of region "A" of FIG. 2.
Figure 4:
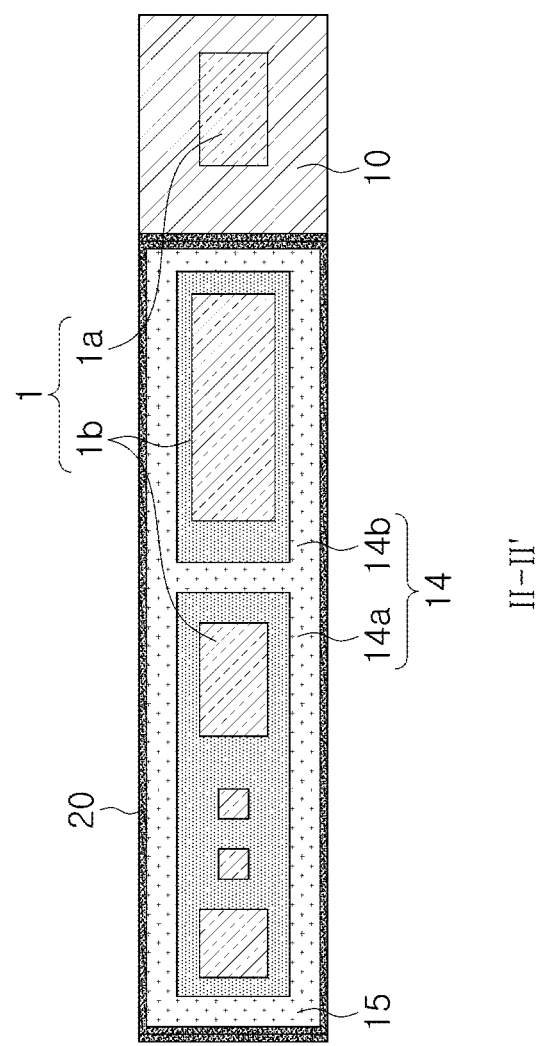
FIG. 4 is a cross-sectional view taken along line II-II' of FIG. 2.

FIG. 1 is a perspective view of an electronic device module 100, according to an embodiment. FIG. 2 is a cross-sectional view taken along line I-I' of FIG. 1. FIG. 3 is an enlarged view of region "A" of FIG. 2. FIG. 4 is a cross-sectional view taken along line II-II' of FIG. 2.

Referring to FIGS. 1 to 4, the electronic device module 100 may include a board 10, one or more electronic devices 1, a sealing portion 14, a shielding wall 15 and a shielding layer 20.

Referring to FIG. 2, the board 20 may be a multilayer board 10 formed by repeatedly laminating insulating layers (collectively referred to below as insulating layer 19) and wiring layers 16. If necessary, however, the board 20 may be a double-sided board in which wiring layers 16 are formed on opposite sides of a single insulating layer 19.

The insulating layer 19 is not limited to a particular material. However, the insulating layer 19 may be, for example, formed of a thermosetting resin such as an epoxy resin, a thermoplastic resin such as polyimide, or a resin in which the thermosetting or thermoplastic resin is impregnated with an inorganic filler in a core material such as a glass fiber (or a glass cloth or a glass fabric), or the like, for example, an insulating material such as prepreg, Ajinomoto Build-up Film (ABF), FR-4, and Bismaleimide Triazine (BT).

The wiring layers 16 may be electrically connected to the electronic devices 1, which will be described later, and may be connected to the shielding layer 20 or the shielding wall 15.

A conductive material such as copper (Cu), aluminum (Al), silver (Ag), tin (Sn), gold (Au), nickel (Ni), lead (Pb), titanium (Ti), an alloy of copper (Cu), aluminum (Al), silver (Ag), tin (Sn), gold (Au), nickel (Ni), lead (Pb), and titanium (Ti), or the like may be used as a material of the wiring layers 16.

Interlayer-connecting conductors 18 are disposed inside the insulating layer 19 for the interconnection of the laminated wiring layers 16.

Although not illustrated in the drawings, an insulation-protecting layer may be disposed on a surface of the board 10. The insulation-protecting layer may be formed of solder resist, and may be disposed to entirely cover the insulating layer 19 and wiring layers, among the wiring layers 16, on top and bottom surfaces of the insulating layer 19. Thus, the insulation-protecting layer protects the wiring layer 16 disposed on the top or bottom surface of the insulating layer 19.

As shown in FIGS. 1 and 2, the board 10 includes a first surface (e.g., an upper surface) and a second surface (e.g., a lower surface) disposed opposite to the first surface. The first surface is a mounting surface on which the electronic devices 1 are mounted, and the second surface is a surface opposing a motherboard when the electronic device module 100 is mounted on the motherboard. Mounting electrodes 12 and ground electrodes 13 for mounting the electronic devices 1, and a wiring pattern (not illustrated) connecting the electrodes 12 and 13 may be formed on the first surface of the board.

Connecting electrodes 17 may be disposed on the second surface of the board 10 for connecting a connecting terminal such as a solder ball.

In the illustrated embodiment, the top wiring layer 16 includes a ground line 16a. The ground line 16a is arranged inside the board 10 and may be electrically connected to the ground electrodes 13.

The ground line 16a may be entirely disposed in a region facing the sealing portion 14. Thus, electromagnetic waves flowing into the electronic devices 1 from the bottom of the board 10 or flowing out of the electronic devices 1 in a direction toward the bottom of the board may be blocked by the ground line 16a.

Referring to FIG. 2, one or more electronic devices 1 may be mounted on the mounting electrode 12. Accordingly, a number of the electronic devices 1 may be spaced apart from one another according to a mounting position of the electronic devices 1.

The ground electrode 13 is physically and electrically connected to the shielding wall 15, which will be described later. Accordingly, the ground electrode 13 is disposed along the bottom of the shielding wall 15.

The shielding wall 15 may include a first shielding wall 15a and a second shielding wall 15b. The ground electrode 13 may include a first ground electrode 13a disposed on a bottom of a first shielding wall 15a and a second ground electrode 13b disposed on a bottom of a second shielding wall 15b.

As shown in FIGS. 2 and 3, the ground electrode 13 is disposed on the entire bottom of the shielding wall 15 along a shape of the shielding wall 15. However, the disclosure is not limited to such a configuration. The ground electrode 13 may be embodied in various forms and may, for example, include only the first ground electrode 13a or only the second ground electrode 13b.

In the illustrated embodiment, the ground electrode 13 is formed in a continuously linear shape, but is not limited to such a shape, and thus may be formed in various shapes, such as a dashed line shape, a shape of a plurality of points, or the like, as long as the ground electrode 13 can be electrically connected to the shielding wall 15.

The mounting electrodes 12 and the ground electrodes 13 may be protected by the insulation-protecting layer, and may be exposed externally through an opening formed on the insulation-protecting layer.

As shown in FIG. 2, an antenna 60 may be disposed on the board 10. The antenna 60 may be disposed on the second surface of the board 10 or may be disposed on the board 10 while being adjacent to the second surface of the board 10.

The antenna 60 may be disposed in a region not to face or oppose the shielding layer 20.

For the purposes of this disclosure, the antenna 60 being disposed to face or oppose the shielding layer 20 means that the antenna 60 and the shielding layer 20 are disposed to overlap when projecting the antenna 60 and the shielding layer 20 onto the same plane (e.g., the first surface of the board 10). Thus, the antenna 60 being described as disposed not to face or oppose the shielding layer 20 means that the antenna 60 and the shielding layer 20 are disposed to not overlap when projecting the antenna 60 and the shielding layer 20 onto the same plane.

When the antenna 60 is disposed in a region opposing the shielding layer 20, a wireless signal transmitted through the antenna 60 may be blocked by the shielding wall 15 or the shielding layer 20. Accordingly, in the embodiment of FIGS. 1 to 4, the antenna 60 is disposed only in the region not opposing the shielding layer 20 or the shielding wall 15.

The disclosure is not limited to the above-described configuration of the antenna 60, and the antenna 60 may be disposed in a region opposing the shielding layer 20 when the antenna 60 is configured to only radiate a wireless signal in a direction toward the bottom of the board 10.

For example, in the case of a dipole antenna configured to radiate a wireless signal in a direction parallel to the board 10 (e.g., a board surface direction), it is advantageous to dispose the dipole antenna in the region not opposing the shielding layer 20. In contrast, in a case in which a patch configured to radiate a wireless signal in a direction toward the bottom of the board is employed, the patch antenna may be disposed in the region opposing the shielding layer 20.

Additionally in the illustrated embodiment, the antenna 60 is formed using a circuit pattern formed on the board 10. However, the antenna 60 is not limited to such a construction. The antenna 60 may be embodied in various forms and, for example, a separately manufactured antenna component mounted on the second surface of the board 10 may be used.

Various types of circuit boards (for example, a ceramic board, a printed circuit board, a flexible board, or the like), which are well known in the art, may be used for the board 10.

The electronic devices 1 may include various electronic devices such as passive devices and active devices. In other words, any electronic device that can be mounted on the board 10 or any device that can be built inside the board 10 can be used. Further, the electronic devices 1 are not limited to devices, but may include any of various components that are mounted on the board 10, such as a connector, or components that electrically connect the devices.

As shown in FIGS. 2 and 4, the electronic devices 1 include at least one first component 1a disposed outside of the sealing portion 14, which will be described later, and at least one second component 1b embedded inside the sealing portion 14. For example, the first component 1a may be a connector and the second component 1b may be a passive device or an active device. However, the first component 1a and the second component 1b are not limited to the described examples.

As shown in FIGS. 2 and 4, the sealing portion 14 is disposed on the first surface of the board 10 and seals the second component 1b. The sealing portion 14 surrounds and fixes the second component 1b to safely protect the second component 1b from an external impact. As previously described, however, the first component 1a of the electronic devices 1 is not embedded in the sealing portion 14 and is disposed outside the sealing portion 14.

The sealing portion 14 is formed of an insulating material. For example, the sealing portion 14 may be formed of a resin material such as an epoxy molding compound (EMC), but is not limited to this material. If necessary, a material having conductivity (e.g., a conductive resin, or the like) may be used to form the sealing portion 14. In this example, an insulating sealing member, such as an underfill, may be provided between the second component 1b and the board 10.

The sealing portion 14 may include a first sealing portion 14a and a second sealing portion 14b, which will be described later, separated by the second shielding wall 15b.

The first shielding wall 15a may be disposed along a side surface of the sealing portion 14 and, more particularly, along outer side surfaces of the first sealing portion 14a and the second sealing portion 14b. The second shielding wall 15b may be disposed between the first and second sealing portions 14a and 14b. More specifically, the second shielding wall 15b may be disposed between inner side surfaces of the first and second sealing portions 14a and 14b.

The first shielding wall 15a shields electromagnetic waves flowing from the first component 1a to the second component 1b or from the second component 1b to the first component 1a.

The second shielding wall 15b prevents EMI from generating between the portion of the electronic device 1 (second component 1b) embedded in the first sealing portion 14a and the portion of the electronic device 1 (second component 1b) embedded in the second sealing portion 14b.

The shielding wall 15 may be formed of a conductive material capable of shielding the electromagnetic flow. For example, the shielding wall 15 may be formed of conductive glue such as a solder or a conductive resin, and at least a portion of the shielding wall 15 may be connected to the ground electrode 13 of the board 10.

A height of the shielding wall 15 may be identical to a height of the sealing portion 14. Accordingly, a top surface of the shielding wall 15 may be exposed externally of the sealing portion 14, and the shielding layer 20, which will be described later, may be connected to the exposed shielding wall 15.

The shielding layer 20 is formed along the top surface formed by the sealing portion 14 and the shielding wall 15 and shields electromagnetic waves flowing from the outside into the second component 1b or flowing from the second component 1b to an outside environment. Accordingly, the shielding layer 20 is formed of a conductive material.

As shown in FIG. 2, the shielding layer 20 is connected to the ground electrode 13 via the shielding wall 15, but is not limited to such a configuration. If necessary, the shielding layer 20 may be directly connected to the ground electrode 13.

The shielding layer 20 may be prepared by applying a resin material containing conductive powder to an outer surface of the sealing portion 14 or forming a metal thin film. For example, the shielding layer 20 may be a metal thin film formed through a spray coating method, but is not limited to such a material. Various techniques including sputtering, screen-printing, vapor deposition, electroplating and electroless plating may be used to form the metal thin film.

The shielding layer 20 and the shielding wall 15 may be formed by different manufacturing processes. Accordingly, the shielding layer 20 and the shielding wall 15 may be formed of different materials, but are not limited to being formed of different materials. If necessary, the shielding layer 20 and the shielding wall 15 may be formed of a same material.

The shielding layer 20 is disposed along a surface of the shielding wall 15 exposed externally of the sealing portion 14 and is electrically connected to the shielding wall 15.

Referring to FIGS. 2 and 3, a third, external sealing portion 14c (hereinafter, "external sealing portion") is disposed between the shielding layer 20 and a portion of the board 10 disposed on a surface of the first shielding wall 15a. Due to the external sealing portion 14c, the entire shielding layer 20 is spaced apart from the board 10 or the ground electrode 13 and is connected to the ground electrode 13 via the first shielding wall 15a.

The above-described arrangement of the external sealing portion 14c with respect to the shielding layer 20, the board 10, and the ground electrode 13 is capable of minimizing damage to the board 10 during the manufacturing process of the board electronic device module 100, as will be described in more detail.

The electronic device module 100 having the above-described configuration can not only protect the electronic device 1 from an external environment through the sealing portion 14 or the shielding layer 20, but also can effectively shield electronic waves.

Additionally, because the shielding wall 15 is also disposed between the first and second components 1a and 1b, EMI can be prevented from generating between the first and second components 1a and 1b.

By disposing the antenna 60 in a region in which the shielding layer 20 is not formed, desired radiation of the antenna 60 can be maintained while protecting the first components 1b.

In addition, the shielding layer 20 may be formed by a spray coating method. In this example, a thickness of a portion of the shielding layer 20 formed on a side surface of the first shielding wall 15a is comparatively less than a thickness of a portion of the shielding layer 20 formed on an upper surface of the sealing portion 14. In this regard, when an electronic device module includes only the shielding layer 20, but not the shielding wall 15, it is difficult to secure shielding reliability.

Accordingly, the electronic device module 100 has a double shielding structure including the shielding wall 15 and the shielding layer 20 on a side surface of the sealing portion 14. Since a conductive member (the shielding layer 20 and the shielding wall 15) disposed on the side surface of the sealing portion 14 is configured to be thick enough to shield the electromagnetic wave flow, shielding reliability can be secured.

FIGS. 5 to 9 are diagrams illustrating processes of a method for manufacturing the electronic device module 100, according to an embodiment.

Figure 5:
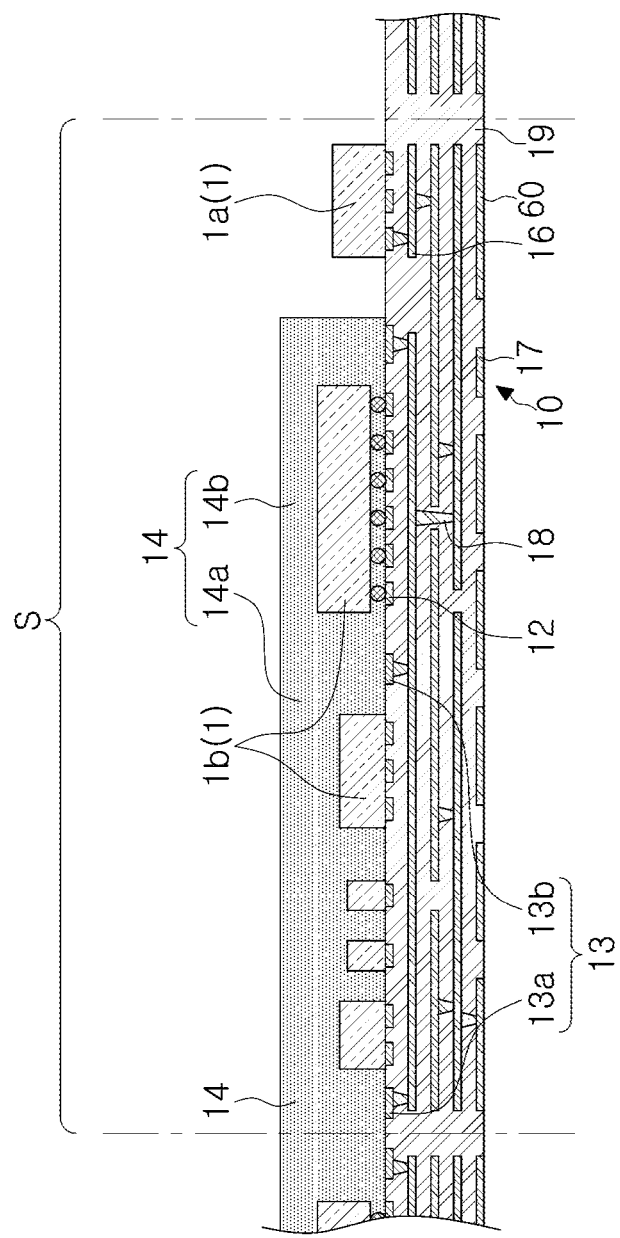
FIGS. 5 to 9 are diagrams illustrating processes of a method of manufacturing the electronic device module of FIG. 1, according to an embodiment.

As illustrated in FIG. 5, electronic devices 1 are mounted on the first surface of the board 10.

The board 10 is a multilayer circuit board, in which circuit patterns electrically connected to each other are formed between layers. Further, the mounting electrodes and ground electrodes 13 are formed on a top surface, which is the first surface, of the board 10.

The board 10, after being prepared during the manufacturing method, has a panel shape or a strip shape. The board 10 is provided in the strip shape to simultaneously prepare multiple electronic device modules. A number of individual package regions S are compartmentalized, and multiple electronic device modules 100 can be simultaneously manufactured in each package region S.

The electronic devices 1 may be connected to the board 10 through conductive glue such as solder. Additionally, the electronic devices 1 may be mounted such that the electronic devices 1 are distributed equally among the individual package regions S.

The sealing portion 14 is formed on the first surface of the board 10 by sealing a portion of the electronic devices 1. The sealing portion 14 is partially formed on the first surface of the board 10. Only the second components 1b of the electronic devices 1 are embedded in the sealing portion 14, and the first components 1a of the electronic devices 1 are disposed outside the sealing portion 14.

The above-described configuration of the sealing portion 14 can be accomplished during molding to form the sealing portion 14 by disposing the first component 1a outside a cavity of a mold. Alternatively, the above-described configuration of the sealing portion 14 can be accomplished by forming the sealing portion 14 on the entire first surface of the board 10, and then partially removing the part of the sealing portion 14 covering the first component 1a.

The sealing portion may be manufactured through a transfer molding method, but is not limited to the transfer molding method.

Figure 6:
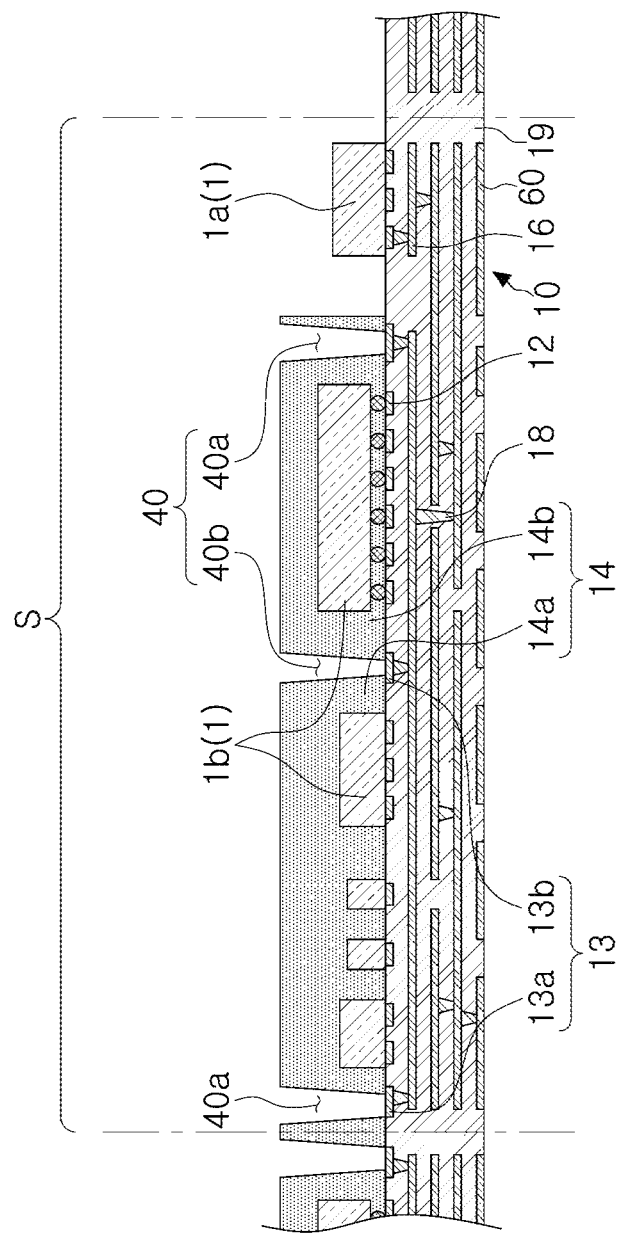

As illustrated in FIG. 6, a trench 40 is formed by partially removing the sealing portion 14. The trench 40 is formed by removing the sealing portion 14 along a position at which the ground electrode 13 is formed. Accordingly, once the trench 40 is formed, the ground electrode 13 is exposed externally through the trench 40.

The trench 40 may be formed by partially removing the sealing portion 14 using a laser. Use of a laser may allow the trench 40 to have a decreasing width in a direction from a top surface of the sealing portion toward the board 10.

The trench 40 may include an external trench 40a formed along a periphery of the sealing portion 14 and an internal trench 40b formed inside the sealing portion 14 and dividing the sealing portion 14. The internal and external trenches 40b and 40a may be connected to each other, but are not limited to such a configuration.

Figure 7:
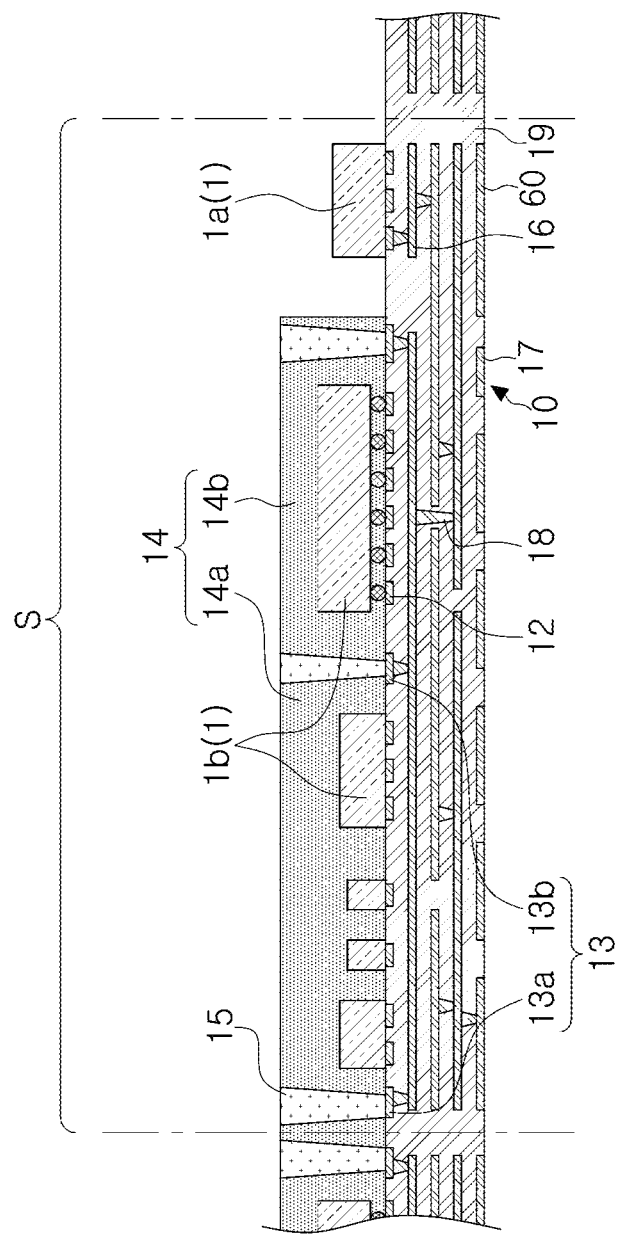

As illustrated in FIG. 7, conductive materials are filled inside the trench 40 to form the shielding wall 15. A conductive paste in which a conductive filler is added to a resin may be used as the conductive material. However, the conductive material is not limited to the described conductive paste. The conductive material may be filled inside the trench by a screen-printing method, but other filling methods are possible.

Once the shielding wall 15 is formed, grinding may be performed to make a top surface of the sealing portion even, if necessary.

As the trench 40 narrows toward the board 10, the shielding wall 15, which is formed inside the trench 40, narrows in a direction from an upper end of the shielding wall 15 toward the board 10.

Figure 8:
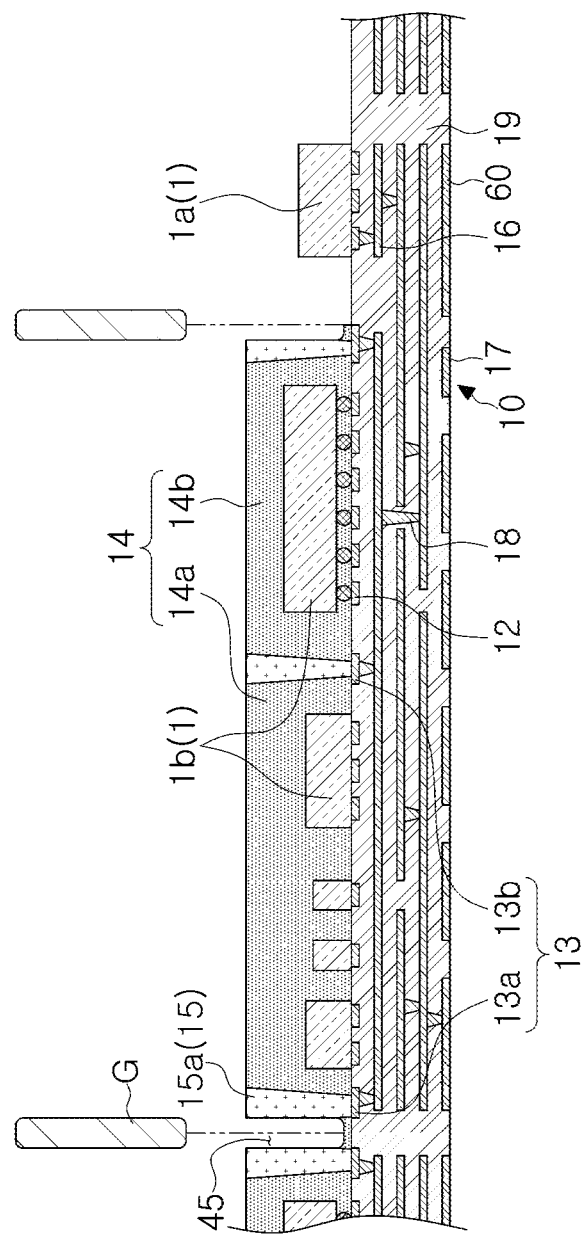

As illustrated in FIG. 8, a part of the sealing portion 14 disposed outside the external trench 40a is then removed. During this process, the part of the sealing portion 14 may be removed using a grinder G having a blade.

As previously described, the trench 40 narrows in a direction toward the board 10. Accordingly, a portion of the first shielding wall 15a may be removed to expose the first shielding wall 15a as much as possible during the removal of the sealing portion 14.

The external sealing portion 14a disposed on an outer side of the first shielding wall 15a, which is disposed along the periphery of the board 10, is not completely removed, and partly remains on the board, as illustrated in FIG. 8. This configuration can be obtained by removing the external sealing portion 14c as much as possible while not allowing the blade of the grinder G to contact the board 10.

Therefore, the external sealing portion 14c is disposed along the periphery of the first shielding wall 15a, and becomes thinner in a direction away from the first shielding wall 15a in accordance with a shape of the blade. The described configuration prevents the wiring layer 16 inside the board 10 from being exposed externally, and/or prevents the board 10 from breaking down due to removal of a portion of the board 10 together with the sealing portion 14. Accordingly, the external sealing portion 14c may remain in various shapes, as long as the board 10 is not broken down by the blade.

The grinder G removes the part of the sealing portion 14 along a boundary of the individual package regions S and exposes the shielding wall 15. Accordingly, a groove 45 may be formed in the sealing portion 14 along the boundary of the individual package regions S, and a thickness of the groove 45 may correspond to a thickness of the blade.

Figure 9:
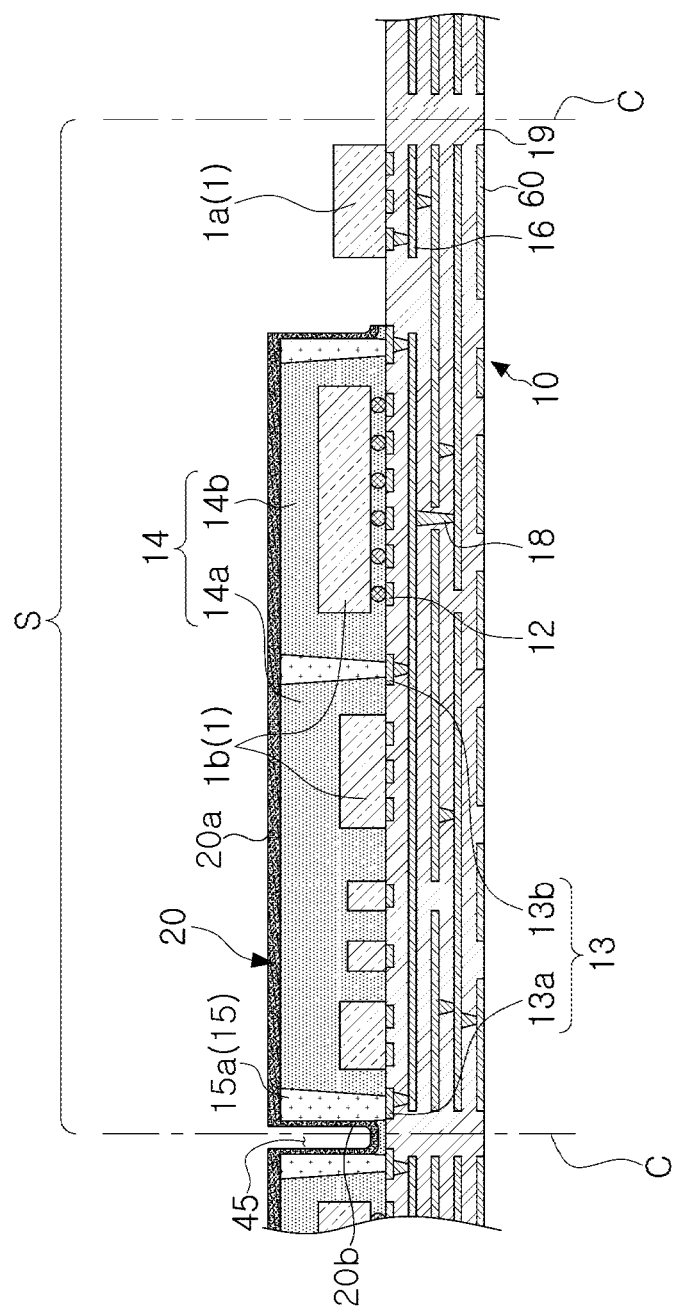

As illustrated in FIG. 9, the shielding layer 20 is formed along a surface formed by the sealing portion 14 and the shielding wall 15.

As previously described, the shielding layer 20 is formed by applying a conductive material to surfaces of the sealing portion 14 and the shielding wall 15 using a spray coating method.

During the application of the shielding layer 20, the shielding layer 20 is also formed on a surface of the external sealing portion 14c. Although not illustrated in the drawing, at least a portion of the shielding layer 20 may extend to the first surface of the board 10, if necessary.

Since the groove 45 is narrow, it is difficult to smoothly apply the conductive material on an entire side surface of the shielding wall 15 during the formation of the shielding layer 20. Accordingly, as illustrated in FIG. 3, a thickness of a portion 20b of the shielding layer formed on a side surface of the first shielding wall 15a is less than that a thickness of a portion 20a of the shielding layer formed on the top surface of the sealing portion 14.

A method for forming the shielding layer 20 is not limited to the method described above. Various methods such as sputtering, spray coating, screen-printing, vapor deposition, electroplating and electroless plating may be used to form the shielding layer 20.

Still referring to FIG. 9, the electronic device module 100, is finally prepared by cutting the board along a boundary C of FIG. 9 of the individual package region S.

Since the above-described manufacturing method employs a board 10 including multiple individual package regions S, multiple electronic device modules 100 can be manufactured simultaneously. Further, since the shielding wall 15 and the shielding layer 20 are provided on a side surface of the sealing portion 14, shielding reliability can be secured even when the shielding layer 20 is formed to be thin on the side surface of the sealing portion 14.

An electronic device module according to the disclosure herein is not limited to the previously described embodiments, and may be implemented in various applications.

Figure 10:
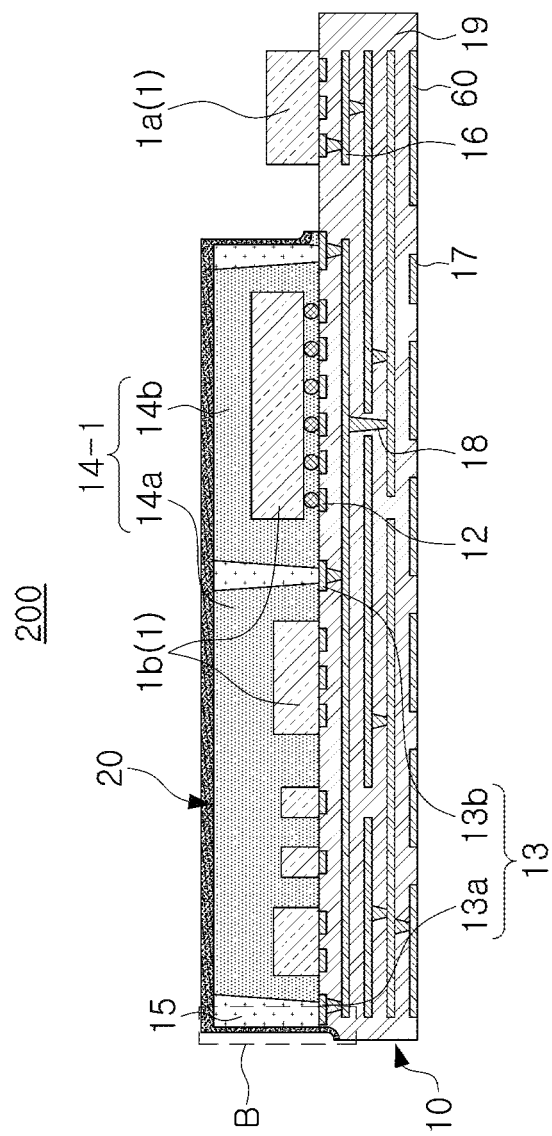
FIG. 10 is a cross-sectional view schematically illustrating an electronic device module, according to an embodiment.
Figure 11:
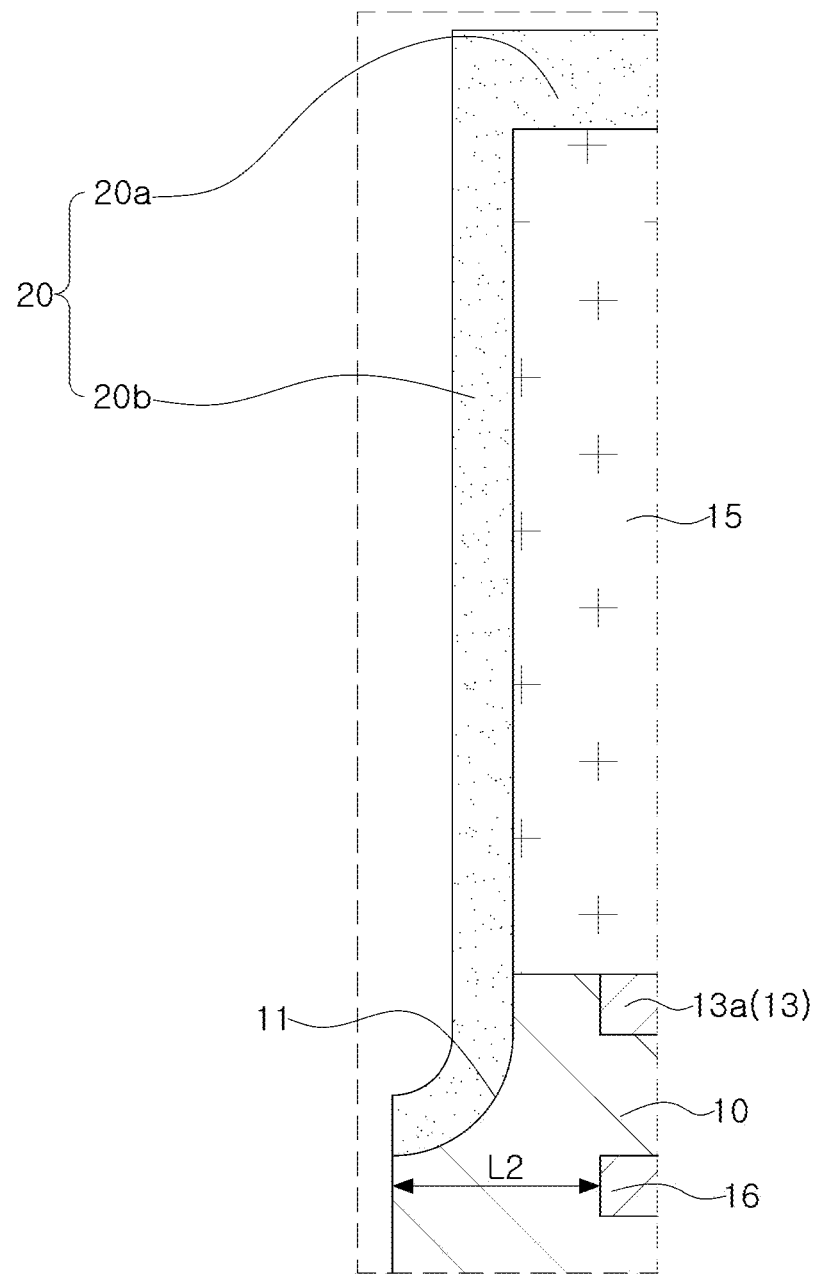
FIG. 11 is an enlarged view of region "B" of FIG. 10.

FIG. 10 is a cross-sectional views schematically illustrating an electronic device module 200, according to an embodiment. FIG. 11 is an enlarged view of region "B" of FIG. 10.

Referring to FIG. 10, the electronic device module 200 is configured similarly to the electronic device module 100 described in the embodiment of FIGS. 1 to 4, but is different in that the external sealing portion 14c of FIG. 2, which is disposed along the side surface of the board 10, is removed from the electronic device module 200, and a shielding layer 20-1 directly contacts the board 10.

The above-described configuration can be accomplished during the process illustrated in FIG. 8 (among all of the previously described manufacturing processes) by entirely removing the entire external sealing portion 14c disposed along the side surface of the board 10 using a grinder, thereby producing a sealing portion 14-1 including the first and second sealing portions 14a and 14b. As shown in FIG. 11, a portion of the board 10 below the external sealing portion 14c is removed along with the external sealing portion 14c and, therefore, a concave groove 11 may be formed on a top surface edge of the board 10.

Accordingly, at least a portion of the shielding layer 20-1 is disposed on the board 10. The groove 11 may be formed along an edge of one surface (e.g., the first surface) of the board 10. Accordingly, the shielding layer 20-1 may be disposed inside the groove 11.

When the ground electrode 13 and the insulating layer 19 of the board 10 are removed together during the removal of the portion of the board 10, the ground electrode 13 may fall apart from the insulating layer 19 due to an impact applied by the grinder.

Accordingly, as shown in FIG. 11, in order to prevent the ground electrode 13 or the wiring layer 16 from being contacted by the grinder when the portion of the board 10 is removed, a distance L2 between the wiring layer 16 and the side surface of the board 10 may be larger than a distance L1 (FIG. 3) in the embodiment of FIG. 2. However, the electronic device module 200 is not limited to such a configuration of the distance L2.

Figure 12:
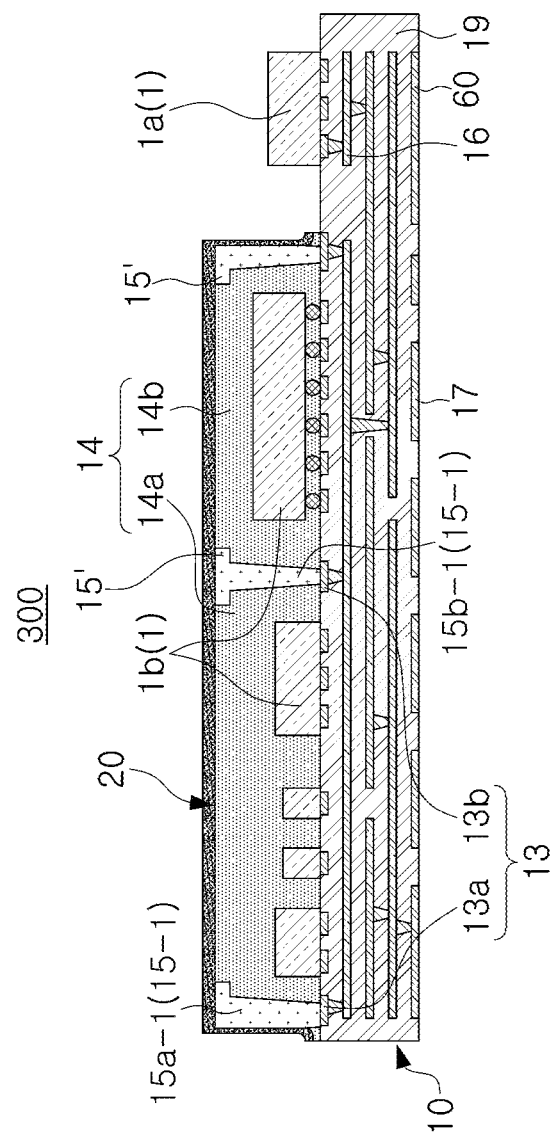
FIG. 12 is a cross-sectional view schematically illustrating an electronic device module, according to an embodiment.

FIG. 12 is a cross-sectional view schematically illustrating an electronic device module 300, according to an embodiment.

Referring to FIG. 12, the electronic device module 300 is configured similarly to the electronic device module 100 described in the embodiment illustrated in FIGS. 2 to 4, but is different with respect to the shape of a shielding wall 15-1.

The shielding wall 15-1 includes an extension portion 15' in which a width of the shielding wall 15-1 is extended. The extension portion 15' extends the width of the shielding wall 15-1 by a step, and the shielding wall 15-1 is formed to have a top surface that is larger than a bottom surface of the shielding wall 15-1.

As illustrated in FIG. 12, a cross-section of a second shielding wall 15b-1 has a T-shape, and a first shielding wall 15a-1, as a portion thereof is removed, has a "T" shape.

During the manufacturing of the electronic device module 300, the first shielding wall 15a-1 and the second shielding wall 15b-1 are all formed to have a T-shape. During the partial removal of the sealing portion 14 as described in FIG. 8, however, a portion of the first shielding wall 15a-1 is removed, and thus, the first shielding wall 15a-1 and the second shielding wall 15b-1 are eventually formed to have the shape illustrated in FIG. 12.

In previously described FIG. 2, the conductive materials are filled in the trench 40 using a screen-printing method. In this case, a space for a squeegee to move is required. To fill the conductive materials in the external trench 40a formed on the first component 1a, the external sealing portion 14c formed on the first component 1a should be formed to have a pre-determined size.

In this regard, the sealing portion 14 and the first component 1a in a final product should be spaced apart by a pre-determined distance. Accordingly, when the sealing portion 14 and the first component 1a need to be arranged closer together, it is difficult to use the screen-printing method.

Therefore, the conductive materials are filled in the trench 40 by a dispensing method using a dispenser during the manufacturing of the electronic device module 300. In this case, the distance between the sealing portion 14 and the first component 1a can be minimized as a size of the external sealing portion 14c does not matter in the final product.

However, when configuring the trench 40 as in the embodiment of FIG. 2, it is difficult to accurately inject the conductive materials into the trench 40 during the dispensing of the conductive materials due to a narrow opening of an upper portion of the trench 40, and thus, the conductive materials may be applied to the outside of the trench 40. To solve such problem, a width of the upper portion of the trench 40 is extended so that the previously described extension portion 15' can be formed during the manufacturing of the trench 40.

Accordingly, the opening of the trench is broadened, and the conductive materials can be smoothly and precisely injected into the trench 40.

The opening of the trench 40 in the embodiment of FIG. 12 may be formed to have a width or diameter twice as large as that in the embodiment illustrated in FIG. 6, but is not limited to having such a width or diameter. Further, although the T-shaped trench 40 and shielding wall 15-1 are formed in the embodiment of FIG. 12, various modifications are feasible, such as a funnel-shaped trench 40, a trench 40 having an extended overall width as wide as that of the extension portion 15', or the like.

The electronic device module has according to embodiments disclosed herein has a double shielding structure including a shielding wall and a shielding layer disposed on a side surface of a sealing portion of the electronic device module, thereby increasing shielding reliability.

In the embodiments described above, the board is cut after the shielding layer is formed. However, various modifications can be employed. For example, the board may be cut first and the shielding layer may be formed after the board is cut.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module, comprising:
a board;
a ground electrode disposed on a first surface of the board;
first and second electronic devices mounted on the first surface of the board;
a sealing portion disposed on the first surface of the board embedding the second electronic device;
a first shielding wall connected to the ground electrode and disposed to divide the sealing portion; and
a shielding layer formed of a conductive material and disposed along a surface formed by the sealing portion and the first shielding wall,
wherein the first shielding wall comprises an extension portion at the surface formed by the sealing portion and the first shielding wall, and
wherein the first shielding wall comprises a T-shape in cross-section.

2. The electronic device module of claim 1, wherein the second electronic device comprises a plurality of second electronic devices.

3. The electronic device module of claim 1, wherein the shielding layer is spaced apart from the board.

4. The electronic device module of claim 3, further comprising an external sealing portion disposed between the board and a bottom of the shielding layer.

5. The electronic device module of claim 1, wherein at least a portion of the shielding layer is disposed on the board.

6. The electronic device module of claim 1, wherein a width of the first shielding wall decreases in a direction from an end of the first shielding wall spaced from the board toward the board.

7. The electronic device module of claim 6, wherein the extension portion is disposed at a top portion of the first shielding wall and has a width that is greater than a width of a remainder of the first shielding wall.

8. The electronic device module of claim 6, wherein a top surface of the first shielding wall is larger than a bottom surface of the first shielding wall.

9. The electronic device module of claim 1, further comprising a second shielding wall connected to the ground electrode and disposed along a side surface of the sealing portion.

10. The electronic device module of claim 1, further comprising an antenna disposed on a second surface of the board opposite to the first surface of the board, or disposed inside the board and adjacent to the second surface of the board.

11. The electronic device module of claim 1, wherein the extension portion extends the width of the first shielding wall.

12. The electronic device module of claim 1, wherein the extension portion comprises a step and a top surface is greater than a bottom surface disposed on the board.

13. The electronic device module of claim 1, wherein a top surface of the shielding wall is greater than a bottom surface of the shielding wall disposed on the board.

14. The electronic device module of claim 1, wherein the first shielding wall comprises a funnel shape in cross-section from a wider cross-section to a narrower cross-section toward the board.

15. An electronic device module, comprising:
a board;
a ground electrode disposed on a first surface of the board;
an electronic device mounted on the first surface of the board;
a sealing portion disposed on the first surface of the board embedding the electronic device;
a shielding wall connected to the ground electrode and disposed to divide the sealing portion;
a shielding layer formed of a conductive material and disposed along a surface formed by the sealing portion and the shielding wall; and
an antenna disposed on a second surface of the board opposite to the first surface of the board, or disposed inside the board and adjacent to the second surface of the board,
wherein the shielding wall comprises a T-shape in cross-section, and a width of the shielding wall decreases in a direction from an end of the shielding wall spaced from the board toward the board.

16. The electronic device module of claim 15, wherein the shielding wall comprises an extension portion disposed at a top portion of the shielding wall and having a width that is greater than a width of a remainder of the shielding wall.

17. The electronic device module of claim 16, wherein the extension portion extends the width of the shielding wall.

18. The electronic device module of claim 16, wherein the extension portion comprises a step.

19. The electronic device module of claim 16, wherein the shielding wall comprises a tapered shape in cross-section.

20. The electronic device module of claim 15, wherein the antenna is disposed to overlap an area outside the sealing portion on the first surface.

21. An electronic device module, comprising:
a board;
a ground electrode disposed on a surface of the board;
first and second electronic devices mounted on the surface of the board;
a sealing portion disposed on the surface of the board embedding the second electronic device;
a shielding wall formed of a conductive material disposed in the sealing portion; and
a shielding layer formed of a conductive material and disposed along a surface formed by the sealing portion and the shielding wall,
wherein the first electronic device is disposed a predetermined distance from the sealing portion, and
wherein the sealing portion comprises an outer sealing portion disposed between the first electronic device and the shielding wall, and an inner sealing portion disposed between the second electronic device and the shielding wall.

22. The electronic device module of claim 21, wherein a width of the shielding wall decreases in a direction from an end of the shielding wall spaced from the board toward the board.

23. The electronic device module of claim 21, wherein the shielding wall comprises an extension portion at the surface formed by the sealing portion and the shielding wall.

24. The electronic device module of claim 23, wherein the extension portion comprises a step and a top surface is greater than a bottom surface disposed on the board.

25. The electronic device module of claim 23, wherein the shielding wall comprises a tapered shape in cross-section.

26. The electronic device module of claim 21, wherein the shielding wall comprises a T-shape in cross-section and a top surface is greater than a bottom surface disposed on the board.

\* \* \* \* \*